(12) United States Patent
Chu et al.

(10) Patent No.: US 11,854,844 B2
(45) Date of Patent: *Dec. 26, 2023

(54) METHOD OF OPERATING TRANSPORT SYSTEM

(71) Applicant: TAIWAN SEMICONDUCTOR MANUFACTURING CO., LTD., Hsinchu (TW)

(72) Inventors: Chi-Yuan Chu, Taichung (TW); Jen-Ti Wang, Taichung (TW); Wei-Chih Chen, Taichung (TW); Kuo-Fong Chuang, Taoyuan (TW); Cheng-Ho Hung, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/842,340

(22) Filed: Jun. 16, 2022

(65) Prior Publication Data

US 2022/0328330 A1  Oct. 13, 2022

Related U.S. Application Data

(63) Continuation of application No. 16/787,966, filed on Feb. 11, 2020, now Pat. No. 11,367,637.

(51) Int. Cl.
*H01L 21/67* (2006.01)
*H01L 21/677* (2006.01)

(52) U.S. Cl.
CPC .... *H01L 21/67242* (2013.01); *H01L 21/6773* (2013.01); *H01L 21/67253* (2013.01); *H01L 21/67259* (2013.01); *H01L 21/67265* (2013.01); *H01L 21/67724* (2013.01); *H01L 21/67742* (2013.01); *H01L 21/67745* (2013.01); *H01L 21/67766* (2013.01)

(58) Field of Classification Search
CPC ........... H01L 21/67724; H01L 21/6773; H01L 21/67253; H01L 21/67259; H01L 21/67745; H01L 21/67766; H01L 21/67733
See application file for complete search history.

(56) References Cited

U.S. PATENT DOCUMENTS

| | | | |
|---|---|---|---|
| 8,712,600 | B2 | 4/2014 | Hayashi |
| 9,758,308 | B1 * | 9/2017 | Nishikawa ........ H01L 21/67727 |
| 10,067,510 | B2 | 9/2018 | Mullan |
| 10,564,632 | B2 | 2/2020 | Hsu |
| 2011/0178657 | A1 | 7/2011 | Harasaki |
| 2020/0075375 | A1 | 3/2020 | Li |
| 2020/0176294 | A1 | 6/2020 | Chen |
| 2020/0243363 | A1 | 7/2020 | Yuasa |
| 2020/0361041 | A1 * | 11/2020 | Chien .................... B08B 13/00 |

* cited by examiner

*Primary Examiner* — Kaitlin S Joerger
(74) *Attorney, Agent, or Firm* — Maschoff Brennan (57) ABSTRACT

A method of operating a transport system includes detecting an anomalous condition of a wafer transfer vehicle; sending the wafer transfer vehicle along a rail to a diagnosis station adjacent to the rail; and inspecting properties of the wafer transfer vehicle, such as a speed, a weight, an audio frequency, a noise level, a temperature, and an image of the wafer transfer vehicle, by using the diagnosis station.

20 Claims, 5 Drawing Sheets

METHOD OF OPERATING TRANSPORT SYSTEM

PRIORITY CLAIM AND CROSS-REFERENCE

This present application is a continuation application of U.S. patent application Ser. No. 16/787,966, filed Feb. 11, 2020, now U.S. Pat. No. 11,367,637, issued on Jun. 21, 2022, which are herein incorporated by reference in their entirety.

BACKGROUND

In a wafer manufacturing process, wafers are processed multiple times at different process chambers. Wafers are stored in wafer container units such as a front opening unified pod or a wafer cassette. The wafer container units are temporarily positioned on load ports near certain process chambers, and moved from one load port to another. An automated handling system is used for transporting the wafer container units between processing stations. The wafer container units are picked up and moved by wafer transfer vehicles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments relates to automatic diagnosis of a wafer transfer vehicle at a diagnosis station. The diagnosis station is set up with the proper tools for inspecting corresponding properties of the wafer transfer vehicle. By inspecting the appropriate properties of the wafer transfer vehicle, the problem or defect of the wafer transfer vehicle can be identified. The automatic diagnosis can be incorporated into an automated material handling system (AMHS) used for transferring wafer containers in a semiconductor fabrication facility.

Figure 1:
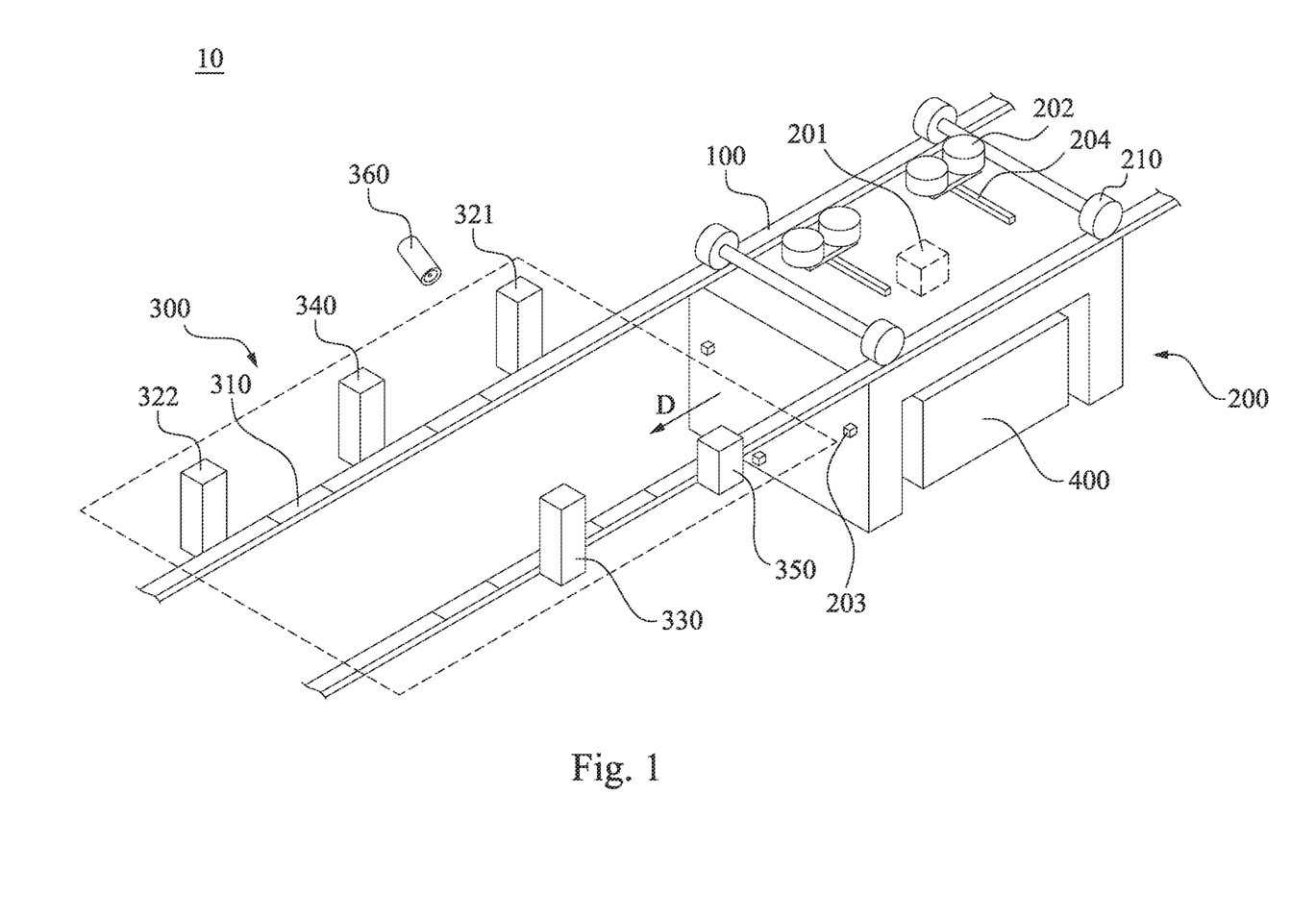
FIG. 1 shows a perspective view of a transport system according to some embodiments of the present disclosure.

FIG. 1 shows a perspective view of a transport system 10 according to some embodiments of the present disclosure. During a fabrication process, a container 400 is transported by the transport system 10, between processing stations in a semiconductor fabrication facility. The container 400 may accommodate wafers. The transport system 10 includes a rail 100, and a wafer transfer vehicle 200 configured to move on the rail 100. The wafer transfer vehicle 200 is an overhead hoist transfer (OHT) that can pick up and unload the wafer container 400 at different locations of the semiconductor fabrication facility, such as processing stations and measuring stations. The transport of the wafer container 400 by the wafer transfer vehicles 200 is an automated process which in which the wafer transfer vehicle 200 is functioning and undamaged. If the wafer transfer vehicle 200 is damaged, the container 400 having wafers therein will not be transferred in a safe and timely manner, and continued usage of the damaged wafer transfer vehicle 200 may result in further damage to products (e.g., wafers).

Figure 2:
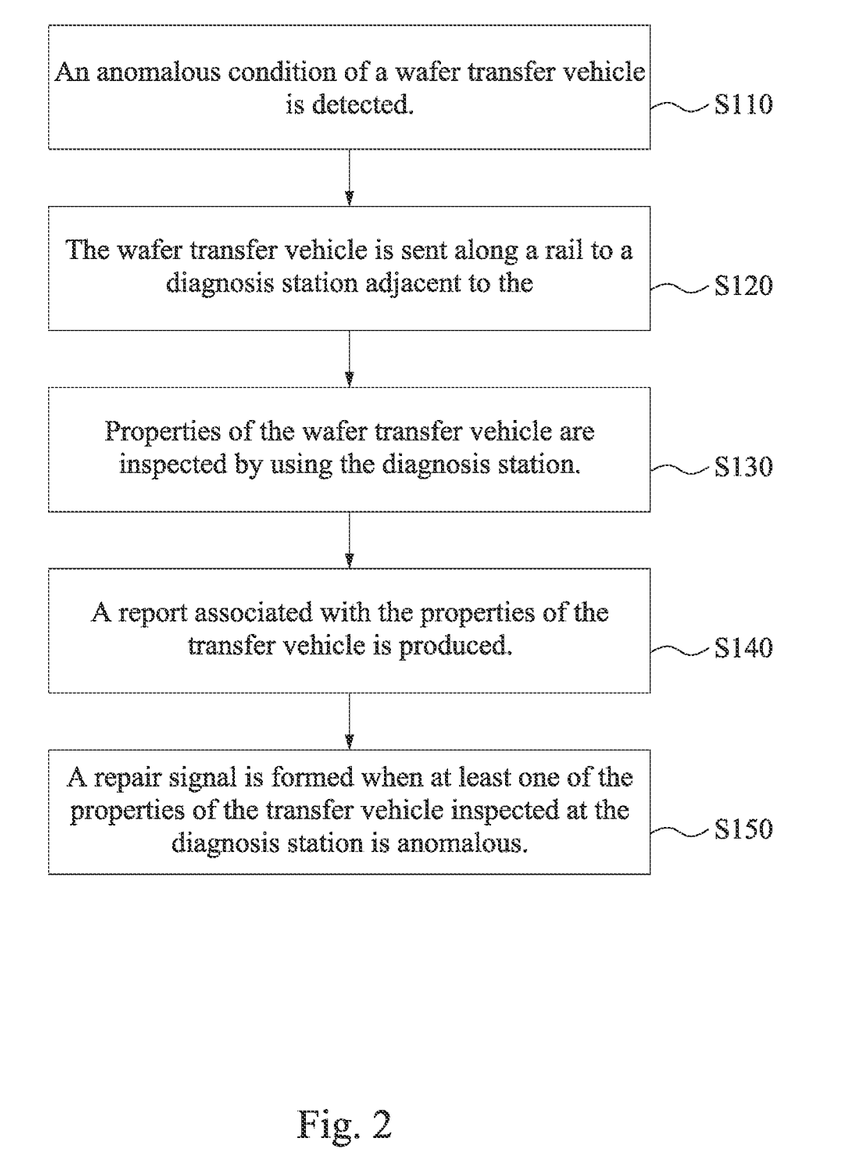
FIG. 2 shows a method of operating a transport system according to some embodiments of the present disclosure.

FIG. 2 shows a method of operating a transport system according to some embodiments of the present disclosure. The method begins with operation S110 in which an anomalous condition of a wafer transfer vehicle is detected. The method continues with operation S120 in which the wafer transfer vehicle is sent along a rail to a diagnosis station adjacent to the rail. The method continues with operation S130 in which properties of the wafer transfer vehicle are inspected by using the diagnosis station. The method continues with operation S140 in which a report associated with the properties of the wafer transfer vehicle is produced. The method continues with operation S150 in which a repair signal is formed when at least one of the properties of the wafer transfer vehicle inspected at the diagnosis station is anomalous. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Reference is made to FIG. 1. Data of the wafer transfer vehicle 200 is recorded every day. The recorded data is managed and analyzed by a data management system, such as big data management system of the AMHS. Based on the data of the wafer transfer vehicle 200, the data management system can identify anomalous conditions of the wafer transfer vehicle 200, and the wafer transfer vehicle 200 can be sent to a maintenance area for repair. Moreover, alarm record associated with the wafer transfer vehicle 200 can be recorded in the AMHS (fab scope), and inspections can be defined to execute whether the wafer transfer vehicle 200 is recalled or not based on the comparison between the alarm record and other indexes for correlation.

In operation S110 of FIG. 2, an anomalous condition of the wafer transfer vehicle 200 is detected. The anomalous condition can be a property that indicates that the wafer transfer vehicle 200 may be damaged or have a defect. The anomalous condition can include a certain distance (e.g., mileage) traveled by the wafer transfer vehicle 200 since a last inspection of said wafer transfer vehicle 200. When the distance traveled by the wafer transfer vehicle 200 since the last inspection is greater than a certain threshold, normal wear on the wafer transfer vehicle 200 may create problems in the wafer transfer vehicle 200, and the wafer transfer vehicle 200 may be due for a periodic inspection. The mileage of the wafer transfer vehicle 200 can be saved in big data of the AMHS (fab scope), and the wafer transfer vehicle 200 is inspected by the diagnosis station 300 when a predetermined mileage is reached. The anomalous condition may include a known defect on a portion of a rail 100 traveled by the wafer transfer vehicle 200. The rail defect may cause damage to the wafer transfer vehicle 200 travelling through the defect, so the wafer transfer vehicle 200 that has travelled through the defect portion of the rail 100 is likely to be damaged. The anomalous condition can include a number of failed attempts by the wafer transfer vehicle 200 at loading or unloading the wafer container 400. When the number of attempts at loading or unloading the wafer container 400 onto a load port is greater than an expected number (e.g., one time), the cause of the failed attempts may be a damage or defect of the wafer transfer vehicle 200. The anomalous condition of the wafer transfer vehicle 200 may include an anomalous speed of the wafer transfer vehicle 200 moving on the rail 100, an anomalous temperature of the wafer transfer vehicle 200, an anomalous noise of the wafer transfer vehicle 200, an anomalous audio frequency of sound generated by the wafer transfer vehicle 200, an anomalous weight distribution of the wafer transfer vehicle 200, an anomalous image of a roller 202 of the wafer transfer vehicle 200, or combinations thereof. The roller 202 is on a top surface of the wafer transfer vehicle 200. Before operation S110 of FIG. 2, the method of operating the transport system 10 may further include the above steps of recording daily data of the wafer transfer vehicle 200, and analyzing the data of the wafer transfer vehicle 200 by using the data management system.

In operation S120 of FIG. 2, the wafer transfer vehicle 200 is sent along the rail 100 to a diagnosis station 300. The diagnosis station 300 can be adjacent to the rail 100, such that the wafer transfer vehicle 200 can travel directly and automatically thereto. The location of the diagnosis station 300 can be at a position that does not interfere with movement of other wafer transfer vehicles 200 travelling on the rail 100. The diagnosis station 300 can be combined with the rail 100, such that the wafer transfer vehicle 200 does not have to be raised or lowered to enter the diagnosis station 300, thereby facilitating the operation. Moreover, the location of the diagnosis station 300 can be over a portion of the semiconductor fabrication facility that has no processing stations. In other words, no processing station is located under the diagnosis station 300. In some embodiment, the diagnosis station 300 has the substantially same level as the rail 100. When an anomalous condition is inspected by the diagnosis station 300, the data management system may receive an abnormal signal from the diagnosis station 300 and inform staff. When the wafer transfer vehicle 200 is desired to be lowered from the diagnosis station 300 onto the ground for manual inspection or repair, there is sufficient space under the diagnosis station 300 for the procedure. There is also space for staff to stand on a ladder or other objects, in order to manually inspect the wafer transfer vehicle 200 positioned on the diagnosis station 300.

In operation S130, properties of the wafer transfer vehicle 200 are inspected by using the diagnosis station 300. The properties inspected at the diagnosis station 300 can be related to a damage or defect of the wafer transfer vehicle 200. In some embodiments of the present disclosure, one of the properties inspected at the diagnosis station 300 is a weight distribution of the wafer transfer vehicle 200. The wafer transfer vehicle 200 has weight distributed among four wheels 210 thereof. Other numbers of the wheels 210 are within the scope of the disclosure in various embodiments. Damage to the wafer transfer vehicle 200, specifically to one of the wheels 210 of the wafer transfer vehicle 200, can affect the balance and weight distribution of the wafer transfer vehicle 200. The diagnosis station 300 has a weight sensor 310. In some embodiments, the wafer transfer vehicle 200 is moved to the diagnosis station 300 in a direction D and then stopped such that at least one of the wheels 210 of the wafer transfer vehicle 200 is placed on the weight sensor 310 of the diagnosis station 300. In some embodiments, the wafer transfer vehicle 200 is moved through the diagnosis station 300 in the direction D without stopping. When at least one of the wheels 210 passes through the weight sensor 310, the weight sensor 310 senses the weight applied thereon. When the weight sensed by the weight sensor 310 is out of a predetermined range of weight, the wafer transfer vehicle 200 may have a problem. Specifically, when the weight sensed by the weight sensor 310 is greater than the predetermined range of weight, a foreign object may have fallen onto the wafer transfer vehicle 200. When the weight sensed by the weight sensor 310 is less than the predetermined range of weight, a component or portion of the wafer transfer vehicle 200 may have fallen off and is missing. Therefore, when the weight sensed by the weight sensor 310 is out of the predetermined range of weight, manual inspection may be advised. In some embodiments, the top surface of the weight sensor 310 of the diagnosis station 300 is substantially level with the top surface of the rail 100. In alternative embodiments, the top surface of the weight sensor 310 of the diagnosis station 300 protrudes from the top surface of the rail 100.

In some embodiments, a plurality of weight sensors 310 are disposed at the diagnosis station 300, and each of the weight sensors 310 bears a respective wheel 210 of the wafer transfer vehicle 200 when the wafer transfer vehicle 200 stops at or moves through the diagnosis station 300. When the weight sensed at any of the weight sensors 310 is out of a predetermined range of weight, the wafer transfer vehicle 200 may have a problem and manual inspection may be advised. Moreover, the weight sensed at the weight sensors 310 can be compared to each other, and when the relative weight sensed at the weight sensors 310 are different from each other, the wafer transfer vehicle 200 may have a problem.

In some embodiments, four weight sensors 310 are disposed at the diagnosis station 300, and each of the weight sensors 310 bears a respective wheel 210 of the wafer transfer vehicle 200. Other numbers of the weight sensors 310 are within the scope of the disclosure in various embodiments. Similar to the abovementioned embodiments, the weight sensed by the four weight sensors 310 can be compared to a predetermined weight, and/or to each other. When the weight sensed by the weight sensors 310 are out of a predetermined range of weight, or different from each other, the wafer transfer vehicle 200 may have a problem and manual inspection may be advised. Specifically, if one of the four weight sensors 310 senses a different weight than the other three weight sensors 310 do, then manual inspection of the wheel 210 positioned on said weight sensor 310 may be advised. For example, the wheel 210 sensed by the weight sensor 310 sensing the different weight may be damaged, or separated from the wafer transfer vehicle 200.

In some embodiments, one of the properties inspected at the diagnosis station 300 is a speed of the wafer transfer vehicle 200 as it travels on the rail 100, such as track detection. An extension of the rail 100 of the wafer transport system 10 is at the diagnosis station 300, so as to accurately simulate the wafer transfer vehicle 200 travelling on the rail 100 of the wafer transport system 10 and obtain an accurate measurement of the speed of the wafer transfer vehicle 200 moving on the rail 100. In order to measure the speed of the wafer transfer vehicle 200 travelling on the rail 100, a first speed sensor 321 and a second speed sensor 322 are disposed at the diagnosis station 300. The wafer transfer vehicle 200 is moved in the direction D to pass through, in order, the first speed sensor 321 and then the second speed sensor 322. The first speed sensor 321 detects the wafer transfer vehicle 200 moving there-through and records a first time corresponding to the time of said detection, and the second speed sensor 322 detects the wafer transfer vehicle 200 moving there-through and records a second time corresponding to the time of said detection. The difference between the first time and the second time can be calculated, and used in combination with the constant distance between the first and second speed sensors 321 and 322 to obtain the speed of the wafer transfer vehicle 200. Specifically, the speed of the wafer transfer vehicle 200 is the distance between the first speed sensor 321 and the second speed sensor 322, divided by the difference between the first time and the second time. Damage to the wafer transfer vehicle 200 can affect the speed of the wafer transfer vehicle 200 travelling on the rail 100. When the calculated speed of the wafer transfer vehicle 200 is out of a predetermined range of speed for the wafer transfer vehicle 200, the wafer transfer vehicle 200 may have a problem and manual inspection may be advised. For example, a motor 201 or a gear of the wafer transfer vehicle 200 may be damaged. For each rotation of the wheel 210, the wheel 210 travels on the rail 100 a distance substantially equal to the circumference of the wheel 210. When the wheel 210 is worn and becomes smaller, the circumference of the wheel 210 decreases. Given a constant rotational speed of the wheel 210, when the wheel 210 is worn and has a reduced circumference, the speed of the wafer transfer vehicle 200 is decreased. In some embodiments, the first and second speed sensors 321 and 322 may include positioning marks.

In some embodiments, the wafer transfer vehicle 200 may be moved in a reverse direction for calculating the speed of the wafer transfer vehicle 200. Namely, the wafer transfer vehicle 200 is moved from the second speed sensor 322 to the first speed sensor 321. The second speed sensor detects the wafer transfer vehicle 200 moving there-through and records a third time corresponding to the time of said detection, and the first speed sensor detects the wafer transfer vehicle 200 moving there-through and records a fourth time corresponding to the time of said detection. The difference between the third time and the fourth time is calculated, and used in combination with the distance between the sensors to obtain the speed of the wafer transfer vehicle 200. Similarly, the speed of the wafer transfer vehicle 200 is the distance between the first speed sensor 321 and the second speed sensor, divided by the difference between the third time and the fourth time. If the calculated speed of the wafer transfer vehicle 200 is out of a predetermined range of speed for the wafer transfer vehicle 200, the wafer transfer vehicle 200 may have a problem and manual inspection may be advised. This procedure allows the speed of the wafer transfer vehicle 200 to be measured in the reverse direction, and also saves time because the wafer transfer vehicle 200 can be tested again directly by travelling back to the first speed sensor 321, instead of moving back to a position past the first speed sensor 321, and then moving it past the first speed sensor 321 and the second speed sensor 322 again.

In some embodiments, one of the properties inspected at the diagnosis station 300 is a temperature of the wafer transfer vehicle 200, specially a temperature of a portion of the wafer transfer vehicle 200. Damage to the wheels 210 or other parts of the wafer transfer vehicle 200 may create abnormal friction between parts of the wafer transfer vehicle 200, which may lead to abnormal heating. For example, the damaged motor 201 results in overheating of the wafer transfer vehicle 200. Therefore, a high temperature can be an indication of damage or defect of the wafer transfer vehicle 200. The diagnosis station 300 further has a temperature sensor 330, arranged at a position to measure the temperature of the wafer transfer vehicle 200. Specifically, the temperature can be arranged to measure the temperature near the motor 201 of the wafer transfer vehicle 200, the temperature at a portion of the wafer transfer vehicle 200 proximal to one of the wheels 210 thereof, or the temperature of an entirety of the wafer transfer vehicle 200. The temperature can be measured when the wafer transfer vehicle 200 is stationed at the diagnosis station 300, or when the wafer transfer vehicle 200 moves through the diagnosis station 300. When the measured temperature is out of a predetermined range of temperature of the corresponding portion (e.g. the wheel 210, or the motor 201), the wafer transfer vehicle 200 may have a problem, and manual inspection may be advised. In some embodiments, when the measured temperature is higher than a predetermined temperature of the corresponding portion of the wafer transfer vehicle 200, the wafer transfer vehicle 200 may have a problem, and manual inspection may be advised.

In some embodiments, one of the properties inspected at the diagnosis station 300 is a noise formed by the wafer transfer vehicle 200. Damage to the wheels 210 or other parts of the wafer transfer vehicle 200 may create abnormal friction between parts of the wafer transfer vehicle 200, which may lead to noise created by the moving parts. Therefore, a high level of noise can be an indication of damage or defect of the wafer transfer vehicle 200. The diagnosis station 300 further has a decibel meter 340 configured to detect noise from the wafer transfer vehicle 200. When the measured noise level is out of a predetermined range of noise of the wafer transfer vehicle 200, the wafer transfer vehicle 200 may have a problem, and manual inspection may be advised. The duration of the measurement and the predetermined range of noise of the wafer transfer vehicle 200 may be input and customized by a user. In some embodiments, when the measured noise level is higher than a predetermined noise level of the wafer transfer vehicle 200, the wafer transfer vehicle 200 may have a problem, and manual inspection may be advised. The noise level can be measured when the wafer transfer vehicle 200 is stationary. In this case, the measured noise level is compared to a predetermined noise level for a stationary wafer transfer vehicle 200. In alternative embodiments, the noise level can be measured when the wafer transfer vehicle 200 is moving on the rail 100. In this case, the measured noise level is compared to a predetermined noise level for a moving wafer transfer vehicle 200.

In some embodiments, the decibel meter 340 of the diagnosis station 300 measures a power of the noise (e.g. sound waves) generated by the wafer transfer vehicle 200. The power is related to a frequency and amplitude of sound waves generated by the wafer transfer vehicle 200. In other words, the noise level of the wafer transfer vehicle 200 is related to the power of sound waves generated by the wafer transfer vehicle 200. When the measured power of sound waves from the wafer transfer vehicle 200 is out of a predetermined range of power, the wafer transfer vehicle 200 may have a problem, and manual inspection may be advised.

In some embodiments, one of the properties inspected at the diagnosis station 300 is an audio frequency formed by the wafer transfer vehicle 200. Damage to the wafer transfer vehicle 200 can alter sound waves generated by the wafer transfer vehicle 200. Therefore, an unusually high level audio frequency or an unusually low audio frequency can be an indication of damage or defect of the wafer transfer vehicle 200. The diagnosis station 300 further has a microphone 350 configured to detect the audio frequency of sound waves generated by the wafer transfer vehicle 200. When the measured audio frequency is out of a predetermined range of audio frequency of the wafer transfer vehicle 200, the wafer transfer vehicle 200 may have a problem, and manual inspection may be advised. The duration of the measurement and the predetermined range of audio frequency of the wafer transfer vehicle 200 may be input and customized by a user. The audio frequency can be measured when the wafer transfer vehicle 200 is stationary, and the measured audio frequency is compared to a predetermined audio frequency for a stationary wafer transfer vehicle 200. In alternative embodiments, the audio frequency can be measured when the wafer transfer vehicle 200 is moving on the rail 100. In this case, the measured audio frequency is compared to a predetermined audio frequency for a moving wafer transfer vehicle 200.

In some embodiments, one of the properties inspected at the diagnosis station 300 is an image of the wafer transfer vehicle 200. Damage to the wafer transfer vehicle 200 can be visible cracks to parts of the wafer transfer vehicle 200, such as the roller 202 or the wheel 210 of the wafer transfer vehicle 200. The diagnosis station 300 has an image sensor 360 configured to capture an image of the wafer transfer vehicle 200. Specifically, the image sensor 360 can be configured to capture an image of one of the rollers 202 and the wheels 210 of the wafer transfer vehicle 200. The capture image may be analyzed by artificial intelligence, and determined through machine learning to be normal or abnormal. In addition to the image captured by the image sensor 360, sound waves detected by the decibel meter 340 and the microphone 350 can also be analyzed by machine learning.

After the diagnosis station 300 detects the properties of the wafer transfer vehicle 200, in operation S140 of FIG. 2, a report associated with the properties of the wafer transfer vehicle is produced. In operation S150 of FIG. 2, a repair signal is formed to notify staff when at least one of the properties of the wafer transfer vehicle inspected at the diagnosis station 300 is anomalous. In some embodiments, a suggestion and a record associated with the properties of the wafer transfer vehicle may be further produced.

Figure 3:
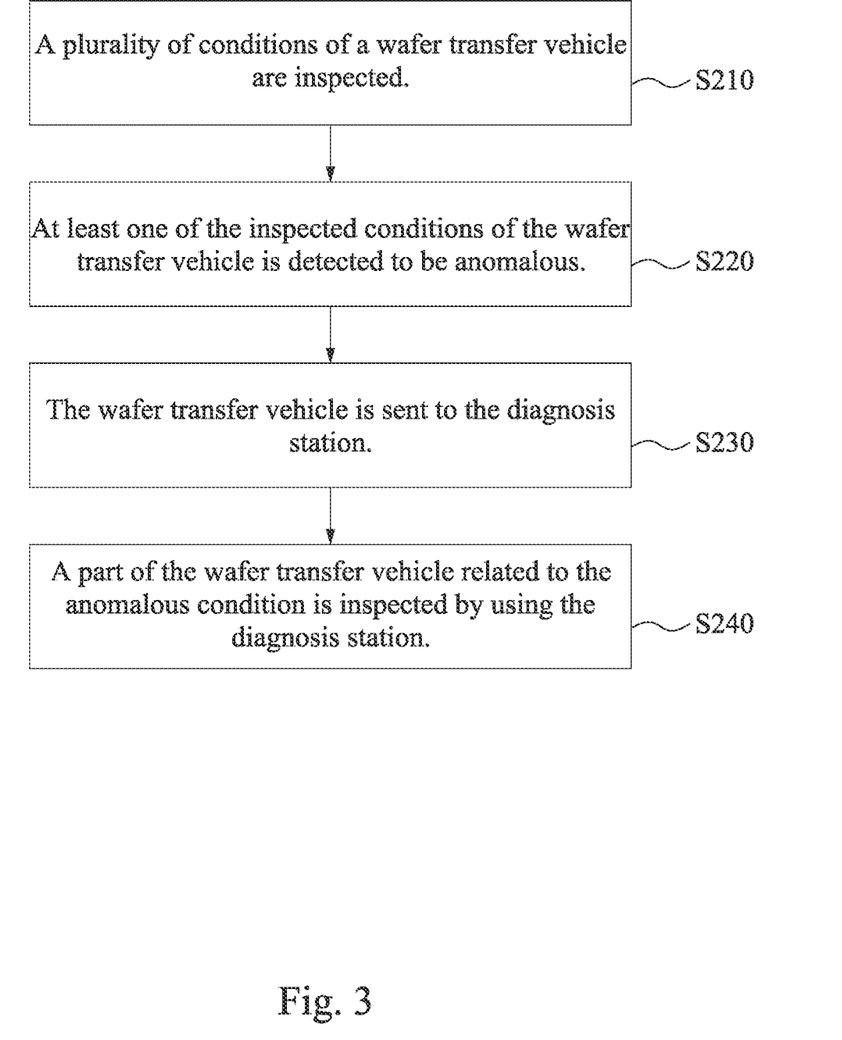
FIG. 3 shows a method of operating a transport system according to some embodiments of the present disclosure.

FIG. 3 shows a method of operating a transport system according to some embodiments of the present disclosure. The method begins with operation S210 in which a plurality of conditions of a wafer transfer vehicle are inspected. The method continues with operation S220 in which at least one of the inspected conditions of the wafer transfer vehicle is detected to be anomalous. The method continues with operation S230 in which the wafer transfer vehicle is sent to the diagnosis station. The method continues with operation S240 in which a part of the wafer transfer vehicle related to the anomalous condition is inspected by using the diagnosis station. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

In operation S210 and referring to FIG. 1, a plurality of conditions of the wafer transfer vehicle 200 are inspected. Some of the conditions may be anomalous. The anomalous condition can be a property that indicates that the wafer transfer vehicle 200 may be damaged or have a defect.

In operation S220, at least one of the inspected conditions of the wafer transfer vehicle 200 is detected to be anomalous. Thereafter, in operation S230, the wafer transfer vehicle 200 is sent to the diagnosis station 300 for further inspection. In operation S240, the wafer transfer vehicle 200 is inspected by the diagnosis station 300. Specifically, a part of the wafer transfer vehicle 200 related to the anomalous condition detected in operation S230 inspected.

In some embodiments, the anomalous condition detected in operation S220 is a certain distance traveled by the wafer transfer vehicle 200 since a last inspection of said wafer transfer vehicle 200. When the distance traveled by the wafer transfer vehicle 200 since the last inspection is greater than a certain threshold, normal wear on the wafer transfer vehicle 200 may create problems in the wafer transfer vehicle 200, and the wafer transfer vehicle 200 may be due for a periodic inspection. Therefore, in operation S240, the overall wafer transfer vehicle 200 is inspected. Namely, all parts of the wafer transfer vehicle 200 go through a periodic inspection. The inspection is similar to those mentioned above, and is not further described herein.

In some embodiments, the anomalous condition detected in operation S220 is a known defect on a portion of the rail 100 traveled by the wafer transfer vehicle 200. The rail defect can cause damage to wafer transfer vehicles 200 travelling through the defect, so the wafer transfer vehicle 200 that has travelled through the defect portion of the rail 100 is likely to be damaged. Therefore, in operation S240, the wheels 210 of the wafer transfer vehicle is inspected. Specifically, a temperature of a portion of the wafer transfer vehicle 200 proximal to the wheels 210 thereof is measured by using the temperature sensor 330. A weight distribution of the wafer transfer vehicle 200 is measured at the respective wheels 210 by using at least one weight sensor 310 bearing the weight of the respective wheel 210. Noise level and audio frequency are detected by using the decibel meter 340 and a microphone 350, respectively, as the wafer transfer vehicle 200 moves at the diagnosis station 300 to analyze sound generated by the wheels 210 when the wafer transfer vehicle 200 moves on the rail 100. An image of the wheel 210 of the wafer transfer vehicle 200 is captured by the image sensor 360 and analyzed by machine learning.

In some embodiments, the anomalous condition detected in operation S220 is a number of failed attempts by the wafer transfer vehicle 200 at loading or unloading the wafer container 400. When the number of attempts at loading or unloading the wafer container 400 onto a load port is excessively high, the cause of the failed attempts may be a damage or defect of winding belts of the wafer transfer vehicle 200, or the ability of the wafer transfer vehicle to accurately align with the load port. Therefore, in operation S240, the winding belts of the wafer transfer vehicle 200 is inspected, and part of the wafer transfer vehicle 200 related to alignment with the load port is inspected. Specifically, noise level and audio frequency are detected by using the decibel meter 340 and the microphone 350, respectively, to analyze sound generated by the winding belt when the wafer transfer vehicle 200 winds and unwinds the winding belts to raise and lower the wafer container 400. An image of the winding belts of the wafer transfer vehicle 200 is captured by the image sensor 360 and analyzed by machine learning.

In some embodiments, the anomalous condition detected in operation S220 is an anomalous speed of the wafer transfer vehicle 200 moving on the rail 100. In operation S240, a speed of the wafer transfer vehicle 200 is inspected again at the diagnosis station 300, and if the speed is determined to be anomalous, part of the wafer transfer vehicle 200 related to movement is inspected. Specifically, a temperature of a portion of the wafer transfer vehicle 200 proximal to the wheels 210 and the motor 201 thereof is measured by using the temperature sensor 330. A weight distribution of the wafer transfer vehicle 200 is measured at the respective wheels 210 by using at least one weight sensor 310 bearing the weight of the respective wheel 210. Noise level and audio frequency are detected by using the decibel meter 340 and the microphone 350, respectively, as the wafer transfer vehicle 200 moves at the diagnosis station 300 to analyze sound generated by the wheels 210 when the wafer transfer vehicle 200 moves on the rail 100. An image of the wheel 210 of the wafer transfer vehicle 200 is captured by an image sensor 360 and analyzed by machine learning.

In some embodiments, the aforementioned noise detection, temperature detection, weight detection, positioning detection, image detection, and speed (or track) detection are sequentially performed to the wafer transfer vehicle 200.

Referring again to FIG. 1, in some embodiments of the present disclosure, the wafer transfer vehicle 200 of the transport system 10 further has at least one traffic sensor 203 arranged at the front. The traffic sensor 203 may be an obstacle sensor (OBS) configured to detect object distances in front of the wafer transfer vehicle 200, so as to identify other wafer transfer vehicles on the rail 100 and avoid colliding with the same or other equipment. In some embodiments, the wafer transfer vehicle 200 has three traffic sensors 203. Other numbers of the traffic sensors 203 are within the scope of the disclosure in various embodiments. The traffic sensor 203 at the middle can detect other wafer transfer vehicles directly in front of the wafer transfer vehicle 200. The traffic sensors 203 at the sides can detect other wafer transfer vehicles adjacent to the wafer transfer vehicle 200, such as on adjacent rails.

Figure 4:
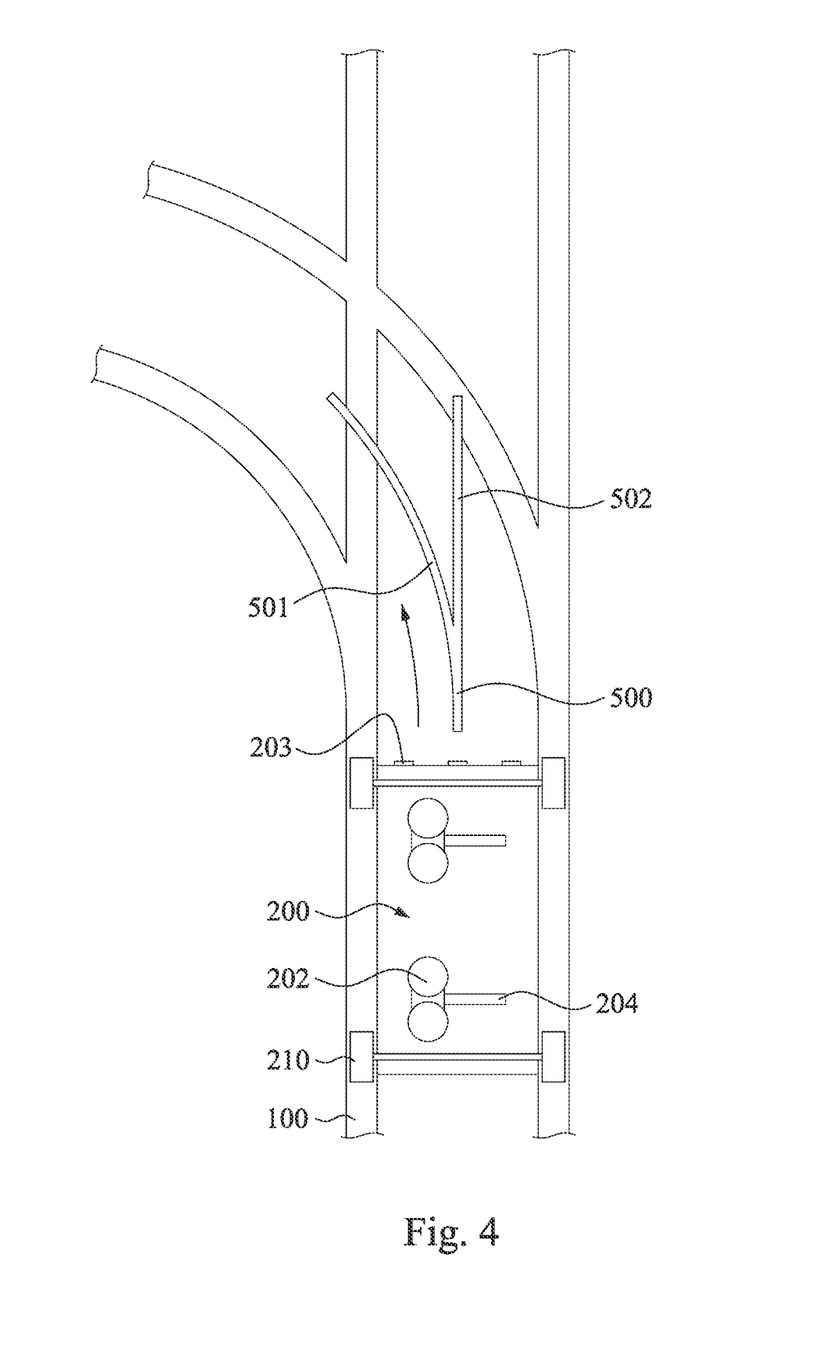
FIG. 4 and FIG. 5 show top views of the transport system of FIG. 1 at different states.
Figure 5:
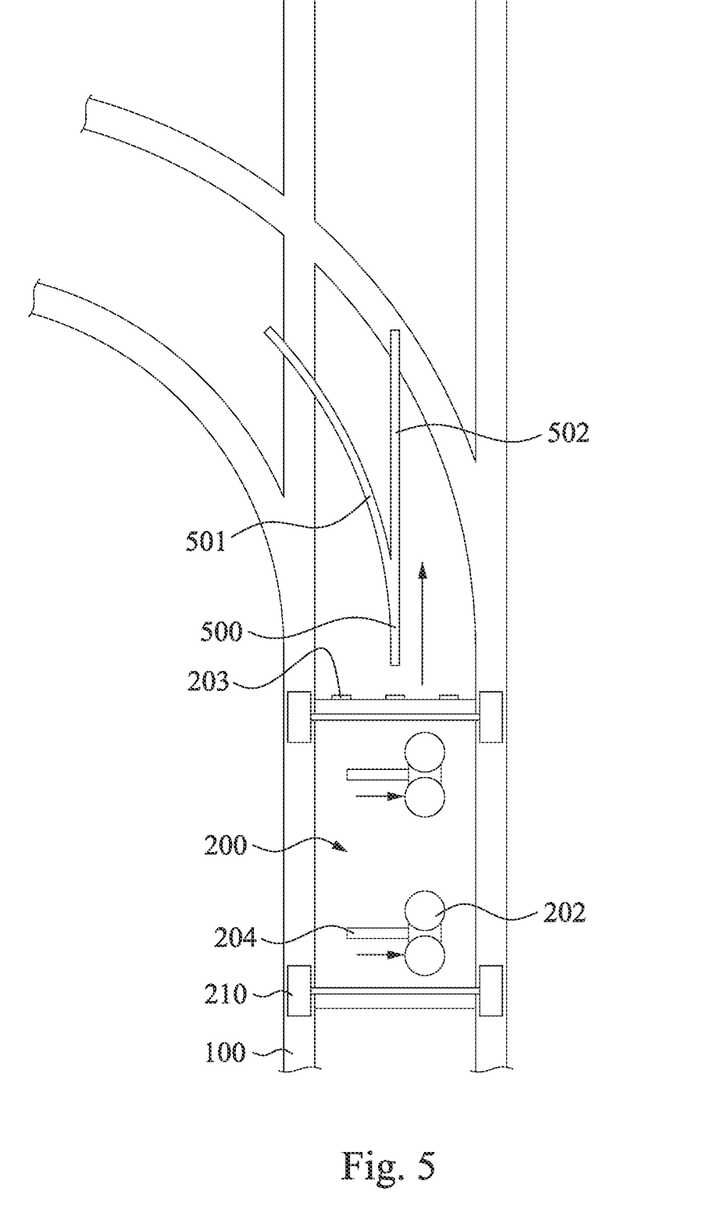

FIG. 4 and FIG. 5 show top views of the transport system 10 at different states. As shown in FIG. 1, FIG. 4 and FIG. 5, the wafer transport system 10 includes the rail 100, the wafer transfer vehicle 200, the diagnosis station 300, and a roller guide 500. The rollers 202 are slidably arranged on a horizontal beam 204 on top of the wafer transfer vehicle 200. In some embodiments, two pairs of rollers 202 are each slidably arranged on a corresponding horizontal beam 204. Other numbers of the rollers 202 are within the scope of the disclosure in various embodiments. Referring to FIG. 4 and FIG. 5, each pair of rollers 202 can slide to the left or to the right along the corresponding horizontal beam 204. The roller guide 500 is selectively positioned at certain locations along and above the rail 100, specifically at locations where the wafer transfer vehicle 200 can move to different paths of the rail 100. As shown in FIG. 4, when the rollers 202 are at the left part of the horizontal beam 204, the rollers 202 can engage a first roller guide portion 501 of the roller guide 500, and are driven to turn left, thereby guiding the wafer transfer vehicle 200 to the left path of the rail 100. As shown in FIG. 5, when the rollers 202 are at the right part of the horizontal beam 204, the rollers 202 slide past a second roller guide portion 502 of the roller guide 500, and do not change direction, thereby allowing the wafer transfer vehicle 200 to continue on the straight path.

In the aforementioned embodiments, by automating diagnosis of the wafer transfer vehicle, human labor, energy and time are saved for identifying damages and defects of the wafer transfer vehicle. The diagnosis station of the transport system and the method of operating the same employ a variety of tools and methods to inspect several properties of the wafer transfer vehicle, such that a thorough and comprehensive inspection of the wafer transfer vehicle can be achieved.

According to some embodiments of the present disclosure, a method of operating a transport system includes determining whether an anomalous condition of a wafer transfer vehicle is met; requesting the wafer transfer vehicle to move along a rail to a diagnosis station when the anomalous condition of a wafer transfer vehicle is met; and inspecting properties of the wafer transfer vehicle by using the diagnosis station.

According to some embodiments of the present disclosure, a method of operating a transport system includes inspecting a plurality of conditions of a wafer transfer vehicle; detecting at least one of the conditions as anomalous; requesting the wafer transfer vehicle to move to a diagnosis station; and inspecting a part of the wafer transfer vehicle related to the anomalous condition by using the diagnosis station.

According to some embodiments of the present disclosure, a method of operating a transport system includes requesting a wafer transfer vehicle to move to a diagnosis station having a first speed sensor and a second speed sensor; moving the wafer transfer vehicle to pass through the first speed sensor; detecting the wafer transfer vehicle by the first speed sensor, and recording a first time corresponding to the detection of the wafer transfer vehicle by the first speed sensor; moving the wafer transfer vehicle to pass through the second speed sensor; detecting the wafer transfer vehicle by the second speed sensor, and recording a second time corresponding to the detection of the wafer transfer vehicle by the second speed sensor; and dividing a distance between the first speed sensor and the second speed sensor, by a difference between the first time and the second time, to obtain a speed of the wafer transfer vehicle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   determining whether a wafer transfer vehicle is in an anomalous condition;
   requesting the wafer transfer vehicle to move to a diagnosis station in response to the determination determines that the wafer transfer vehicle is in the anomalous condition;
   moving the wafer transfer vehicle to a weight sensor of the diagnosis station; and
   stopping the wafer transfer vehicle when a wheel of the wafer transfer vehicle is on the weight sensor.

2. The method of claim 1, further comprising:
   measuring a temperature of the wafer transfer vehicle by using a temperature sensor of the diagnosis station.

3. The method of claim 2, wherein measuring the temperature of the wafer transfer vehicle comprises measuring a temperature near a motor of the wafer transfer vehicle.

4. The method of claim 2, wherein measuring the temperature of the wafer transfer vehicle comprises measuring a temperature proximal to the wheel of the wafer transfer vehicle.

5. The method of claim 1, further comprising:
   sliding a roller on a top of the wafer transfer vehicle to engage a roller guide along and above a rail.

6. The method of claim 5, further comprising:
   guiding, by the roller and the roller guide, the wafer transfer vehicle to a path of the rail.

7. The method of claim 5, wherein sliding the roller of the wafer transfer vehicle comprises sliding the roller along a horizontal beam on the top of the wafer transfer vehicle.

8. The method of claim 5, further comprising:
   capturing an image of the roller on the top of the wafer transfer vehicle by using an image sensor of the diagnosis station.

9. The method of claim 1, further comprising:
   detecting a noise from the wafer transfer vehicle by using a decibel meter of the diagnosis station.

10. The method of claim 1, further comprising:
    analyzing an audio frequency from the wafer transfer vehicle by using a microphone of the diagnosis station.

11. A method comprising:
    inspecting a plurality of conditions of a wafer transfer vehicle;
    determining whether at least one of the plurality of conditions is anomalous;
    in response to the determination determines that the at least one of the plurality of conditions is anomalous, requesting the wafer transfer vehicle to move to a diagnosis station; and
    inspecting a part of the wafer transfer vehicle associated with the anomalous condition by using the diagnosis station, wherein the inspection comprises using a microphone of the diagnosis station to measure an audio frequency of a winding belt of the wafer transfer vehicle.

12. The method of claim 11, further comprising:
    moving the wafer transfer vehicle along a rail.

13. The method of claim 12, further comprising:
    measuring, by a first speed sensor and a second speed sensor adjacent to the rail, a speed of the wafer transfer vehicle during moving the wafer transfer vehicle along the rail.

14. The method of claim 13, further comprising:
    moving the wafer transfer vehicle to pass through the first speed sensor and the second speed sensor in sequence.

15. The method of claim 11, further comprising:
    detecting, by a traffic sensor on a front side of the wafer transfer vehicle, an object distance in front of the wafer transfer vehicle.

16. A method comprising:
    determining whether a wafer transfer vehicle is in an anomalous condition;
    in response to the determination determines that the wafer transfer vehicle is in the anomalous condition, requesting the wafer transfer vehicle to move to a diagnosis station;
    using weight sensors in the diagnosis station to detect weights from wheels of the wafer transfer vehicle; and
    comparing the detected weights to each other.

17. The method of claim 16, further comprising:
    recording a first time when a first speed sensor detects the wafer transfer vehicle moving through the first speed sensor.

18. The method of claim 17, further comprising:
    recording a second time when a second speed sensor spaced apart from the first speed sensor detects the wafer transfer vehicle moving through the second speed sensor.

19. The method of claim 18, further comprising:
    calculating a time difference between the first time and the second time.

20. The method of claim 19, further comprising:
    obtaining a speed of the wafer transfer vehicle based on the time difference and a distance between the first and second speed sensors.

* * * * *